US012534795B2

(12) United States Patent
Ren et al.

(10) Patent No.: US 12,534,795 B2

(45) Date of Patent: Jan. 27, 2026

(54) VACUUM COATING DEVICE FOR UNIFORMLY DISTRIBUTING METAL STEAM BY USING GUIDE PLATE TYPE STRUCTURE

(71) Applicant: BAOSHAN IRON & STEEL CO., LTD., Shanghai (CN)

(72) Inventors: Sanbing Ren, Shanghai (CN); Shanqing Li, Shanghai (CN); Junfei Fan, Shanghai (CN); Fei Xiong, Shanghai (CN); Xiaoli Jin, Shanghai (CN)

(73) Assignee: BAOSHAN IRON & STEEL CO., LTD., Shanghai (CN)

( * ) Notice: Subject to any disclaimer, the term of this patent is extended or adjusted under 35 U.S.C. 154(b) by 442 days.

(21) Appl. No.: 18/016,412

(22) PCT Filed: Jul. 21, 2021

(86) PCT No.: PCT/CN2021/107674
§ 371 (c)(1),
(2) Date: Jan. 16, 2023

(87) PCT Pub. No.: WO2022/017422
PCT Pub. Date: Jan. 27, 2022

(65) Prior Publication Data

US 2023/0340657 A1 Oct. 26, 2023

(30) Foreign Application Priority Data

Jul. 21, 2020 (CN) ........................ 202010702080.0

(51) Int. Cl.
*C23C 14/24* (2006.01)
*C23C 14/16* (2006.01)
(Continued)

(52) U.S. Cl.
CPC ............ *C23C 14/243* (2013.01); *C23C 14/16* (2013.01); *C23C 14/26* (2013.01); *C23C 14/562* (2013.01)

(58) Field of Classification Search
CPC .............................................. C23C 14/24–325
See application file for complete search history.

(56) References Cited

U.S. PATENT DOCUMENTS 5,104,695 A * 4/1992 Greer .................... C23C 14/243 118/728
2007/0074654 A1* 4/2007 Lee ....................... C23C 14/243 117/217
(Continued)

FOREIGN PATENT DOCUMENTS

CN 107815648 A 3/2018
CN 107815648 B 11/2019
(Continued)

OTHER PUBLICATIONS

International Search Report and Written Opinion in connection with international application PCT/CN2021/107674 Issued from the China National Intellectual Property Administration on Oct. 20, 2021.
(Continued)

*Primary Examiner* — Aiden Lee
(74) *Attorney, Agent, or Firm* — Elizabeth L. Neal; DeWitt LLP

(57) ABSTRACT

Disclosed in the present invention is a vacuum coating device for uniformly distributing metal steam by using a guide plate type structure. The vacuum coating device comprises a crucible, wherein an induction heater for heating molten metal in the crucible to form metal steam is arranged outside of the crucible. A top of the crucible is connected to a flow distribution tank body by means of a metal steam pipeline. A horizontal core rod and a pressure stabilizing plate are arranged inside the flow distribution
(Continued)

tank body. The core rod is located below the pressure stabilizing plate. A coating nozzle is arranged at the top of the flow distribution tank body. An induction coil is arranged on the outer side of the flow distribution tank body. A pressure regulating valve is arranged on the metal steam pipeline. A plurality of axial heating holes are provided inside the core rod, resistance wires are arranged inside the heating holes, and a primary guide plate, a secondary guide plate and a tertiary guide plate are arranged on the surface of the core rod; and a buffer groove is provided on the inner wall of the flow distribution tank body, and the buffer groove corresponds to the core rod in position. According to the present invention, when high-temperature steam makes contact with a low-temperature steel plate, a uniform coating is formed on the surface of the steel plate.

17 Claims, 7 Drawing Sheets

(51) Int. Cl.
*C23C 14/26* (2006.01)
*C23C 14/56* (2006.01)

(56) References Cited

U.S. PATENT DOCUMENTS

2008/0216749 A1 9/2008 Aulbach
2009/0304906 A1 12/2009 Suduo et al.
2010/0043710 A1* 2/2010 Min ...................... C23C 14/243 118/726
2013/0280840 A1* 10/2013 Sonoda ................. C23C 14/243 438/758
2013/0323882 A1* 12/2013 Inoue .................... C23C 14/243 118/715
2014/0123899 A1* 5/2014 Jang ........................ C23C 16/54 118/723 R
2021/0115551 A1* 4/2021 Guyaux ................ C23C 14/243
2023/0323526 A1* 10/2023 Ren ......................... C23C 14/26 427/250

FOREIGN PATENT DOCUMENTS

CN 209957886 U 1/2020
JP 2011127137 A 6/2011
JP 2015010257 A 1/2015
KR 20170047493 A 5/2017
WO 2013034404 A1 3/2013
WO 2014168352 A1 10/2014

OTHER PUBLICATIONS

First Office Action issued in connection with the CN application No. 202010702080.0, issued from the Chinese Patent Office on May 7, 2022.
First Search in connection with the CN application No. 202010702080.0, issued from the Chinese Patent Office on Apr. 27, 2022.
"Extended European Search Report received for European Patent Application No. 21846876.7, mailed on Nov. 6, 2023", 9 pages.
"Korean Office Action received for Korean Patent Application No. 10-2023-7001094 mailed on Jan. 13, 2025", 5 pages (2 pages of English Translation and 3 pages of offical copy).

* cited by examiner

VACUUM COATING DEVICE FOR UNIFORMLY DISTRIBUTING METAL STEAM BY USING GUIDE PLATE TYPE STRUCTURE

CROSS-REFERENCE TO RELATED APPLICATIONS

The present application is the U.S. National Stage application of International Application No. PCT/CN2021/107674, filed Jul. 21, 2021, which International Application was published on Jan. 27, 2022, as International Publication No. WO2022/017422. The International Application claims priority to Chinese Patent Application No. 202010702080.0, filed Jul. 21, 2020, the contents of which are incorporated herein by reference in their entireties.

TECHNICAL FIELD

The present application relates to the technical field of vacuum coating, and more particularly, relates to a vacuum coating device for uniformly distributing a metal steam by using a guide plate type structure.

BACKGROUND

Physical vapor deposition (PVD) refers to a process technique that a plated metal is heated under vacuum conditions, so that it is deposited in a gaseous state onto a substrate to form a coating, and depending on different heating modes, it is classified as (resistive or inductive) electric heating, electron beam gun heating (EBPVD), or the like. Vacuum coating, serving as a surface modification and coating process, has been widely applied in electronic, glass, plastic, and other industries, and the vacuum coating technology has main advantages that it is environmental, has good coating performance, and achieves a diversity in plated materials. The key to the use of the vacuum coating technology for continuous strip steel lies in several aspects such as continuous coating production, large-scale production, high-rate production, mass production, etc. Since the 1980s, much research has been conducted on the technology by respective steel companies in the world. The technology is receiving unprecedented attention and is considered to be an innovative surface coating process as the hot galvanizing technology and the electro galvanizing technology become mature.

A key point in vacuum coating is how to obtain a coating with a uniform thickness by arranging the nozzle. The documents disclosed abroad at present mainly involve the following aspects.

1) An Integrated Evaporation Crucible and Flow Distribution Nozzle Structure

The European patents BE1009321A6 and BE1009317A61 respectively disclose crucible nozzle structures as shown in FIG. 1 and FIG. 2. In the structure of FIG. 1, an upper cover 2 is added on an upper part of a crucible 1 such that a nozzle structure is formed between the upper cover 2 and a furnace wall for direct spraying of evaporated metal. In the structure of FIG. 2, a filter plate 3 is added in the evaporation crucible, and then a slit nozzle at the top is used for spraying the metal steam. In the designs of these two device nozzles, one nozzle employs a Laval nozzle structure, and the other nozzle employs a converging nozzle, and one nozzle is located for lateral spraying, and the other nozzle is located for vertical spraying.

The patents JPS59177370A and U.S. Pat. No. 4,552,092A also disclose related evaporation crucible and nozzle structure. FIG. 3 shows a crucible nozzle structure which can automatically replenish a molten metal. A nozzle 4 adopts a wider outlet, and a heater 5 is also arranged at an upper part of the crucible and is used to heat for obtaining a steam, or the like. In the crucible nozzle structure shown in FIG. 4, the structure extends as an arc 6 at one side and achieves a lateral spraying, and a heating pipeline 7 is likewise arranged outside of the crucible wall, for heating the wall surface.

2) A Separated Evaporation Crucible and Flow Distribution Nozzle Structure

The patent WO2018/020311A1 discloses a separated crucible nozzle structure, as shown in FIG. 5, in which a bottom part of a crucible is connected to a molten metal feed tank 8, and an upper part of the crucible delivers a metal steam through a separated pipeline 9 into a tubular distributor and a steam nozzle which is at a front end, and then the metal steam is sprayed to a steel plate at a high velocity through the nozzle.

The patent CN103249860A discloses a separated flow distributor and nozzle structure. As shown in FIG. 6, the steam is delivered into an upper horizontal pipeline 10 through a pipeline, and a top part of the horizontal pipeline 10 is provided with a porous nozzle for uniformly spraying a metal steam onto a surface of a metal plate.

The patent CN101175866A discloses a form of a metal steam flow distributor and nozzle. FIG. 7 shows a cross section of the nozzle; a wire is wound outside of a flow distributor pipeline 11 to heat the pipeline; the nozzle has a square housing, as shown in FIG. 8; a circular pipeline made of another material is nested inside the square housing 12 and is used for spraying a metal steam; and a steam outlet used in the nozzle is porous.

These patents are all related to specific forms of the nozzles in the coating process, but cannot indicate that these nozzles can achieve uniform coating. The coating uniformity of the surface of a steel plate is a key factor for a subsequent process such as bending and punching.

SUMMARY

In view of the above-mentioned defects existing in the prior art, an objective of the present application is to provide a vacuum coating device for uniformly distributing a metal steam by using a guide plate type structure, wherein the metal steam is uniformly distributed and guided by guide plates on a core rod, is subjected to a secondary buffered distribution by a pressure stabilizing plate, and then is sprayed from a coating nozzle to finally form a uniform coating on a surface of a steel plate.

To achieve the above objective, the present application employs the following technical solutions. A vacuum coating device for uniformly distributing a metal steam by using a guide plate type structure comprises a crucible, wherein an induction heater for heating a molten metal in the crucible to form metal steam is arranged outside the crucible; a top of the crucible is connected to a flow distribution tank body by a metal steam pipeline; a core rod and a pressure stabilizing plate, which extend in a horizontal direction, are arranged inside the flow distribution tank body; the core rod is located below the pressure stabilizing plate; a coating nozzle is arranged on top of the flow distribution tank body; an induction coil is arranged outside the flow distribution tank body; and a pressure regulating valve is arranged on the metal steam pipeline.

One or more heating holes extending in an axial direction of the core rod are formed inside the core rod; an resistance wire is arranged inside each heating hole; a primary guide plate, a secondary guide plate and a tertiary guide plate are arranged on a surface of the core rod; the primary guide plate is arranged towards the metal steam pipeline; the secondary guide plate is arranged on an outer side of the primary guide plate; and the tertiary guide plate is arranged on an outer side the secondary guide plate.

A buffer groove is formed in an inner wall of the flow distribution tank body, and the buffer groove corresponds to the core rod in position.

Optionally, the buffer groove is arranged opposite to the core rod in the horizontal direction such that the buffer groove corresponds to the core rod in position.

Optionally, the outer side of the primary guide plate is a side of the primary guide plate facing away from an orifice of the metal steam pipeline in a circumferential direction of the core rod; and the outer side of the secondary guide plate is a side of the secondary guide plate facing away from the orifice of the metal steam pipeline in the circumferential direction of the core rod.

Preferably, the core rod has a circular, elliptical, trapezoidal or rectangular cross section.

Preferably, a length of the primary guide plate is less than a length of the secondary guide plate; and the length of the secondary guide plate is less than a length of the tertiary guide plate.

Preferably, the secondary guide plate and the tertiary guide plate are both provided with opening holes arranged at equal intervals.

Preferably, an angle between the primary guide plate and the secondary guide plate is 15°-45°, and an angle between the secondary guide plate and the tertiary guide plate is 20°-45°.

Preferably, a length L1 of the primary guide plate, a length L2 of the secondary guide plate, a length L3 of the tertiary guide plate, a length h of each opening hole in the secondary guide plate or a length h of each opening hole in the tertiary guide plate, a distance d between the adjacent opening holes in the secondary guide plate or a distance d between the adjacent opening holes in the tertiary guide plate, a power of the resistance wire and a pressure of the metal steam in the metal steam pipeline satisfy the following relationship: when the pressure of the metal steam in the metal steam pipeline is 1000-100000 Pa, L1/L3=0.2-0.4, L2/L3=0.4-0.7, h=2-6 mm, d=8-15 mm, and the power of the resistance wire is 8-20 KW/$m^2$.

Optionally, as the pressure of the metal steam in the metal steam pipeline is increased, a value of L1/L3 is increased, a value of L2/L3 is increased, a value of h is reduced, a value of d is increased, and the power of the resistance wire is increased.

Optionally, when the pressure of the metal steam in the metal steam pipeline is 50000-100000 Pa, L1/L3=0.3-0.4, L2/L3=0.6-0.7, h=2-4 mm, d=12-15 mm, and the power of the resistance wire is 15-20 KW/$m^2$;

- when the pressure of the metal steam in the metal steam pipeline is 10000-50000 Pa, L1/L3=0.25-0.3, L2/L3=0.5-0.6, h=3-5 mm, d=10-12 mm, and the power of the resistance wire is 10-15 KW/$m^2$; and
- when the pressure of the metal steam in the metal steam pipeline is 1000-10000 Pa, L1/L3=0.2-0.25, L2/L3=0.4-0.5, h=4-6 mm, d=8-10 mm, and the power of the resistance wire is 8-10 KW/$m^2$.

Preferably, the pressure stabilizing plate is set to be of a porous structure, a ratio of a total hole area $S_{total\ hole\ area}$ of the pressure stabilizing plate to an airflow channel area $S_{outlet}$ at an outlet of the coating nozzle is greater than or equal to 0.1, i.e., $S_{total\ hole\ area}/S_{outlet} \geq 0.1$.

Preferably, the holes in the pressure stabilizing plate are circular, square or triangular.

Preferably, the holes in the pressure stabilizing plate extend in a straight or curved line.

Preferably, the outlet of the coating nozzle is set to be of a slit type or a porous type. The airflow channel area at the outlet of the coating nozzle is $S_{outlet}$, and an airflow channel area at an interface of the top of the crucible and the metal steam pipeline is $S_{inlet}$, wherein a ratio of $S_{outlet}$ to $S_{inlet}$ is greater than or equal to 0.05-5, i.e., $S_{outlet}/S_{inlet} \geq 0.05\text{-}5$.

Preferably, the coating nozzle is of the slit type, and has a straight or curved profile; or, the coating nozzle is of the porous type, and has a rectangular, circular, or trapezoidal profile.

Preferably, the core rod is connected to the flow distribution tank body by means of threads or inlaying.

According to the vacuum coating device for uniformly distributing a metal steam by using a guide plate type structure provided by the present application, the metal steam is obtained by melting and evaporating the molten metal in the crucible by induction heating of the induction heater; the metal steam enters the flow distribution tank body through the metal steam pipeline; the induction coil is arranged outside the flow distribution tank body for heating, and the core rod with the guide plates is arranged inside the flow distribution tank body; the core rod is fixed inside the flow distribution tank body by means of threads or inlaying, and the axial heating holes are formed in the core rod are heated by the resistance wires. According to the evaporating temperature of the metal steam, and after the nozzle and the core rod are heated to the desired temperature, the pressure regulating valve is opened, and the metal steam enters the flow distribution tank body and impacts onto the surface of the core rod. The guide plates on the surface of the core rod are formed by protruding structures with distributing and guiding functions, and distribute the flow in cooperation with the interior of the flow distribution tank body, thereby achieving the function of distributing the metal steam uniformly into the flow distribution tank body. The pressure stabilizing plate is arranged in the flow distribution tank body for the secondary buffered distribution of the metal steam entering a distribution cavity. Then the metal steam is sprayed out from the coating nozzle and contacts a preprocessed metal plate at high velocity, thereby forming a uniform metal coating.

DETAILED DESCRIPTION

The technical solutions of embodiments of the present application are further described below in connection with the accompanying drawings.

Figure 1:
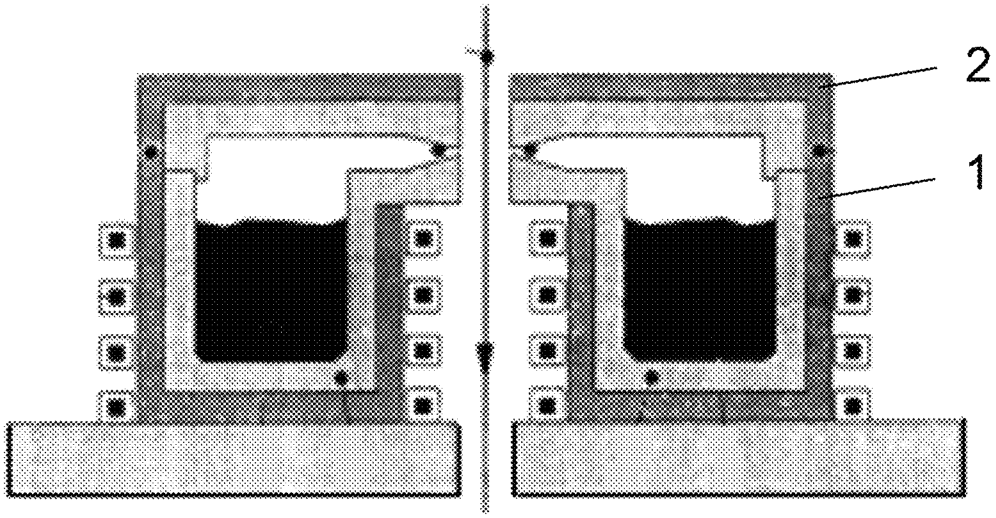
FIG. 1 is a schematic diagram of the European patent BE1009321A6.
Figure 2:
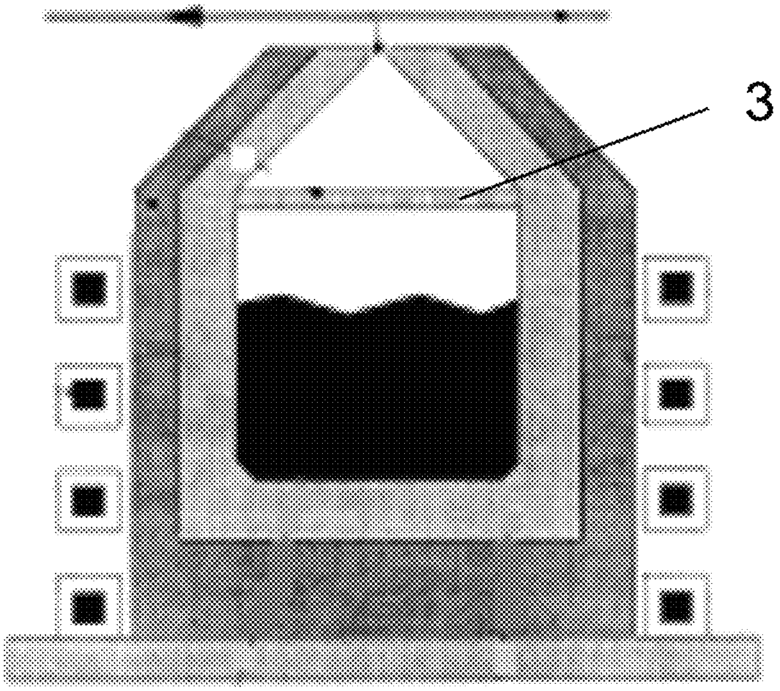
FIG. 2 is a schematic diagram of the European patent BE1009317A61.
Figure 3:
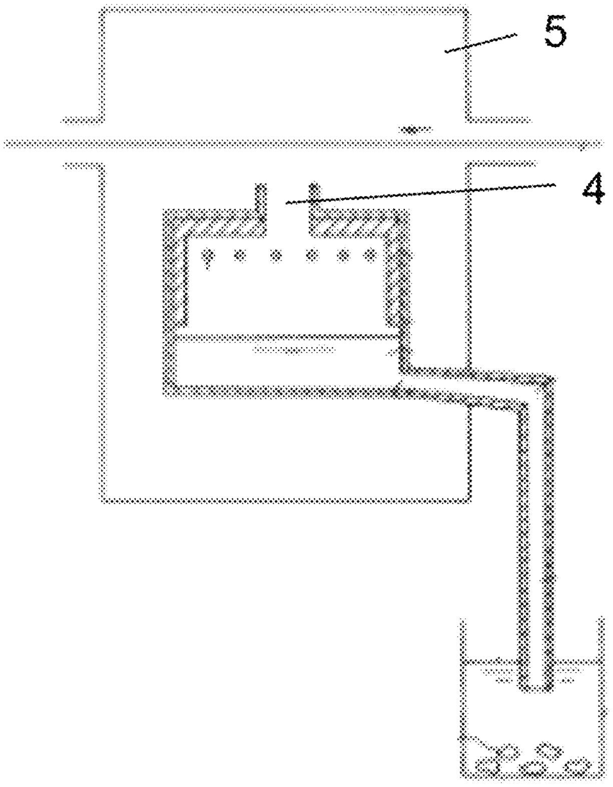
FIG. 3 is a schematic diagram of the patent JPS59177370A.
Figure 4:
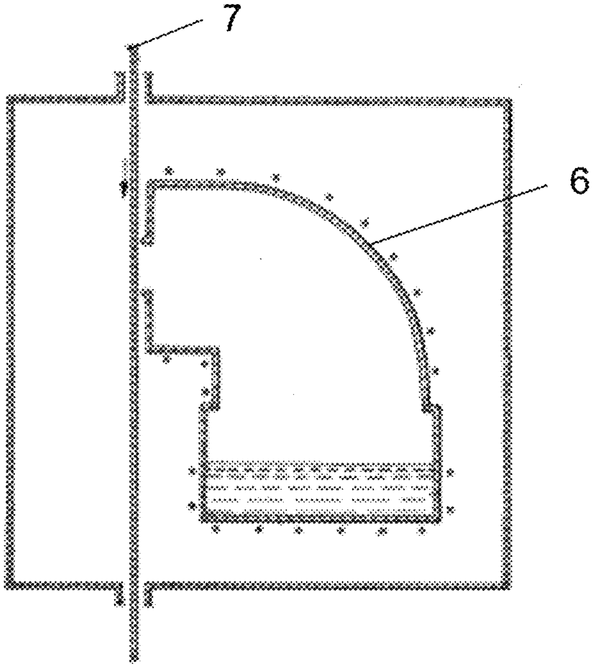
FIG. 4 is a schematic diagram of the U.S. Pat. No. 4,552,092A.
Figure 5:
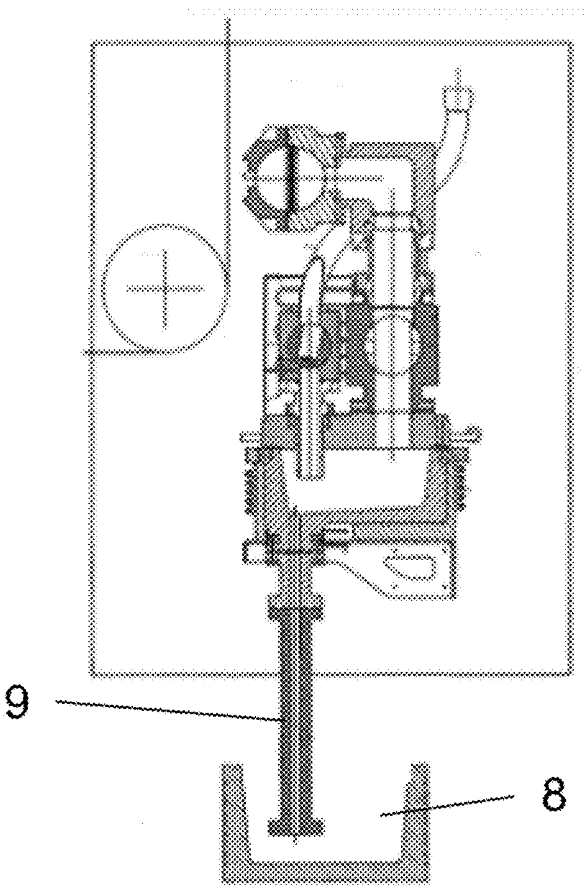
FIG. 5 is a schematic diagram of the patent WO2018/020311A1.
Figure 6:
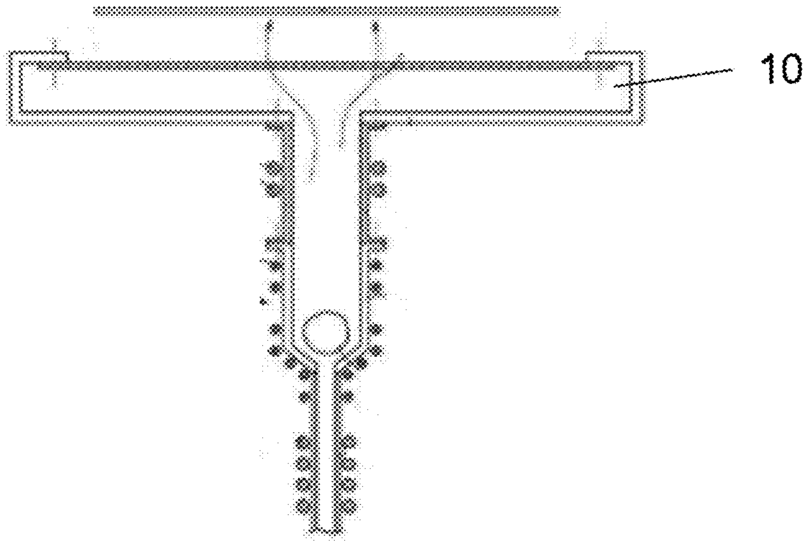
FIG. 6 is a schematic diagram of the patent CN103249860A.
Figure 7:
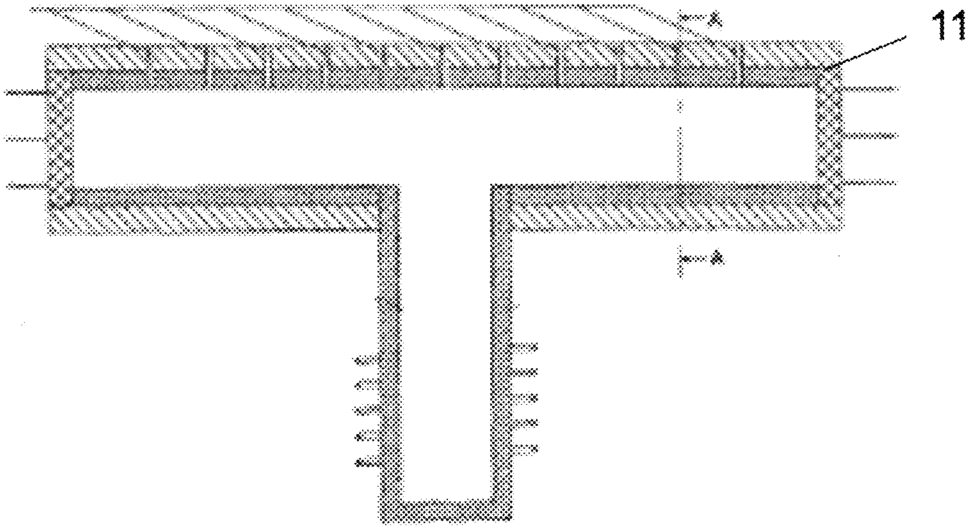
FIG. 7 is a schematic diagram of the patent CN101175866A.
Figure 8:
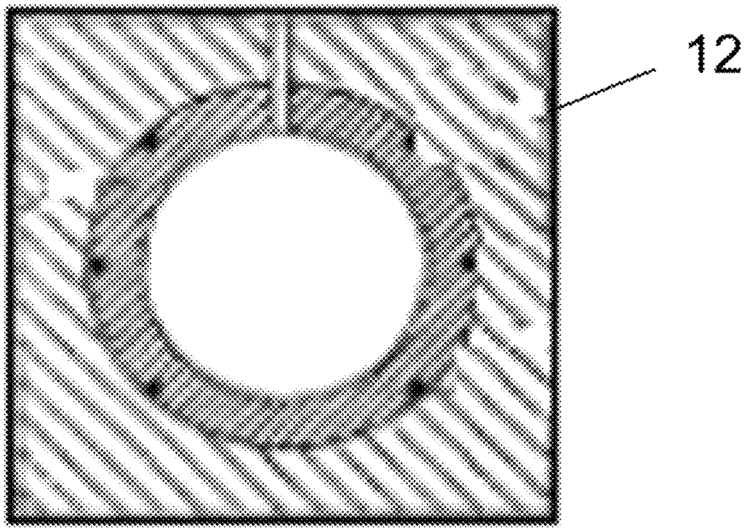
FIG. 8 is a schematic diagram of a square housing of FIG. 7.
Figure 9:
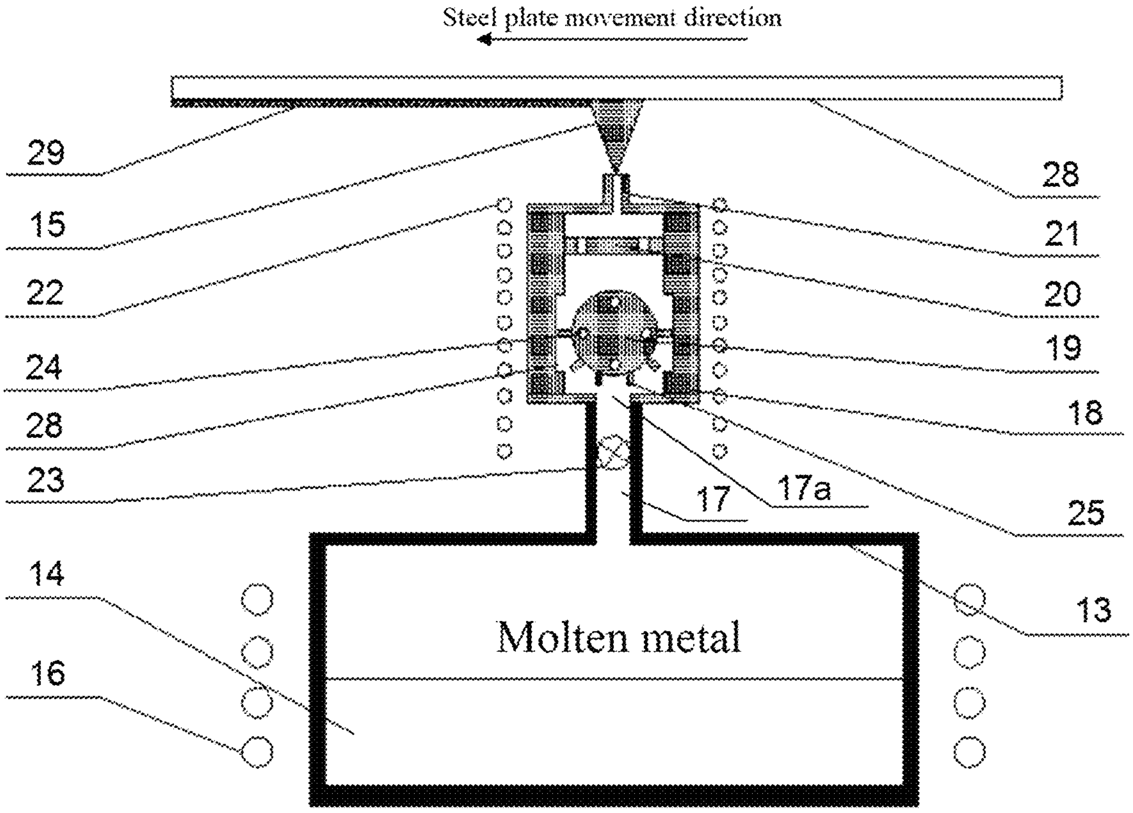
FIG. 9 is a schematic structural diagram of a vacuum coating device provided by an embodiment of the present application.
Figure 10:
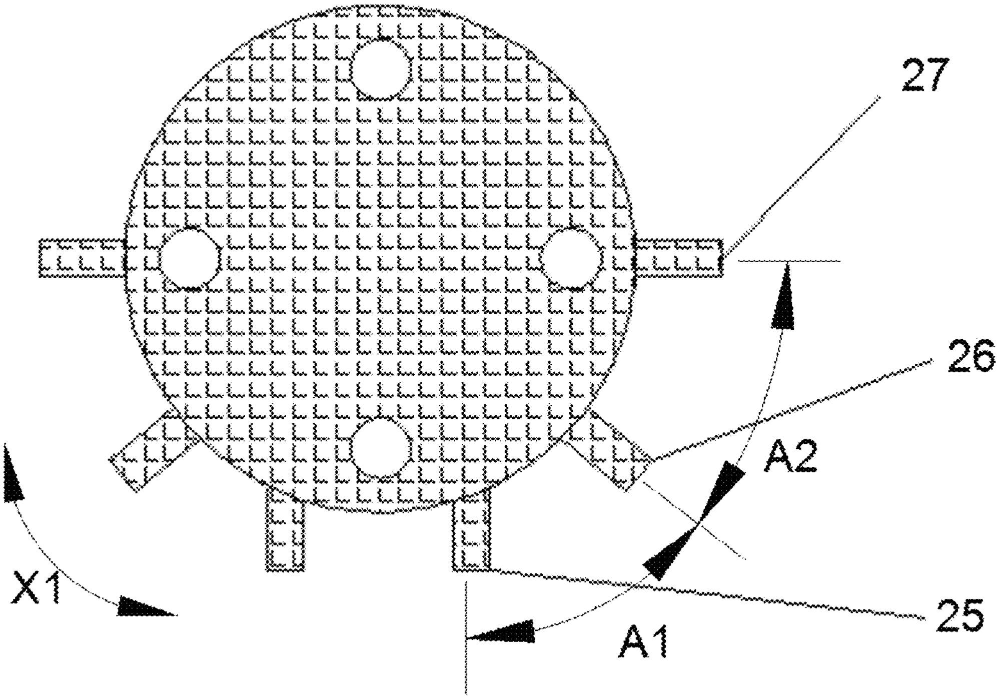
FIG. 10 is a schematic diagram of an arrangement of a primary guide plate, a secondary guide plate, and a tertiary guide plate in a vacuum coating device provided by an embodiment of the present application.
Figure 11:
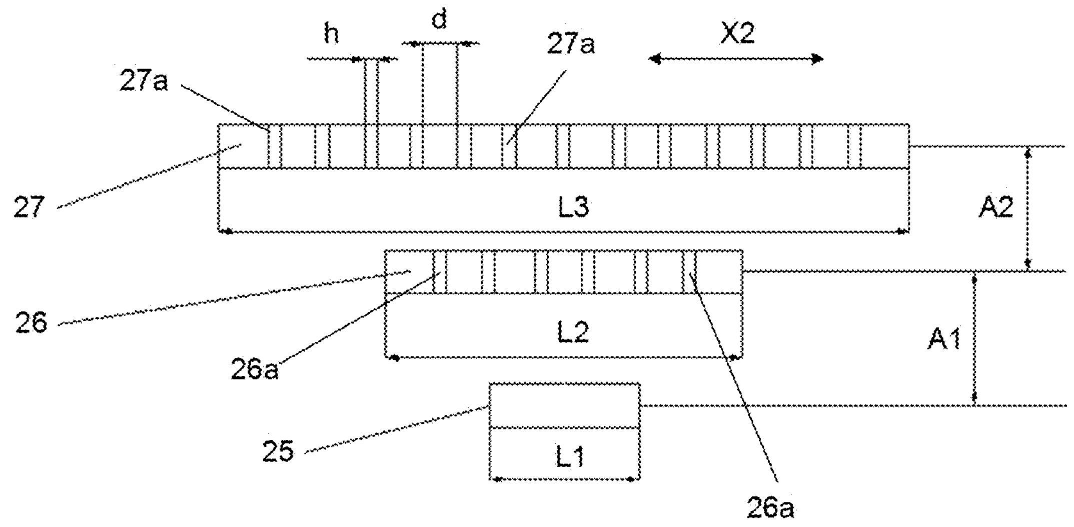
FIG. 11 is a schematic diagram of positional parameters of the primary guide plate, the secondary guide plate, and the tertiary guide plate in the vacuum coating device provided by the embodiment of the present application.

Referring now to FIGS. 9 to 11, an embodiment of the present application provides a vacuum coating device for uniformly distributing metal steam by using a guide plate type structure, including a crucible 13. An induction heater 16 for heating molten metal 14 in the crucible 13 to form a metal steam 15 is arranged outside the crucible 13. A top of the crucible 13 is connected to a flow distribution tank body 18 by a metal steam pipeline 17. A core rod 19 and a pressure stabilizing plate 20, which extend in a horizontal direction, are arranged inside the flow distribution tank body 18. The core rod 19 is located below the pressure stabilizing plate 20. The core rod 19 is connected to the flow distribution tank body 18 by means of threads or inlaying. A coating nozzle 21 is arranged on top of the flow distribution tank body 18. An induction coil 22 is arranged outside the flow distribution tank body 18. A pressure regulating valve 23 is arranged on the metal steam pipeline 17.

One or more heating holes 24 are formed inside the core rod 19. In an example as shown in FIG. 9, the number of the heating holes 24 is four, but the present application is not limited thereto. In other examples, there may be other number of the heating holes 24, for example, 1, 3, 7, 10, etc.

The heating holes 24 extend in an axial direction of the core rod 19 (a direction perpendicular to the paper surface of FIGS. 9 and 10). Resistance wires are provided inside the heating holes 24 for heating the core rod 19, and a surface, facing to the metal steam pipeline 17, of the core rod 19 is provided with two primary guide plates 25, two secondary guide plates 26 and two tertiary guide plates 27. The two secondary guide plates 26 are respectively located on two sides of the primary guide plates 25, and the two tertiary guide plates 27 are respectively located on two sides of the secondary guide plates 26 in a circumferential direction of the core rod 19 (a direction X1 as shown in FIG. 10).

That is, the secondary guide plates 26 are located on outer sides of the primary guide plates 25, and the tertiary guide plates 27 are located on outer sides of the secondary guide plates 26. That is, in the circumferential direction of the core rod 19, the secondary guide plates 26 are located on the sides of the primary guide plates 25 facing away from an orifice 17*a* of the metal steam pipeline 17, and the tertiary guide plates 27 are located on the sides of the secondary guide plates 26 facing away from the orifice 17*a* of the metal steam pipeline 17. By the above arrangement, in the circumferential direction of the core rod 19, the primary guide plates 25, the secondary guide plates 26, and the tertiary guide plates 27 have sequentially increasing distances from the orifice 17*a* of the metal steam pipeline 17.

Across section of the core rod 19 may be circular, elliptical, trapezoidal, rectangular or be in other shapes. The core rod 19 is mainly used for buffered distribution of the metal steam 15 entering the flow distribution tank body 18 from the metal steam pipeline 17, and then the metal steam 15 flows along the surface of the core rod 19. FIG. 10 shows an example of the cross section of the core rod 19, and in the example, the cross section of the core rod 19 is circular.

A length L1 of the primary guide plate 25 is less than a length L2 of the secondary guide plate 26, and the length L2 of the secondary guide plate 26 is less than a length L3 of the tertiary guide plate 27.

The secondary guide plate 26 and the tertiary guide plate 27 are both provided with opening holes arranged at equal intervals and shaped to be rectangular or trapezoidal.

FIG. 11 shows an example of opening holes 26*a* formed in the secondary guide plate 26 and opening holes 27*a* formed in the tertiary guide plate 27. Referring to FIG. 11, a plurality of opening holes 26*a* are equidistantly disposed in a length direction of the secondary guide plate 26 (a direction X2 as shown in FIG. 11), and a plurality of opening holes 27*a* are equidistantly disposed in a length direction of the tertiary guide plate 27 (a direction X2 as shown in FIG. 11). A length of each opening holes 26*a*/each opening holes 27*a* is h, and a distance between the adjacent opening holes 26*a*/adjacent opening holes 27*a* is d. Herein, the symbol "/" indicates an "or" relationship between the two associated objects. For example, "A/B" refers to "A or B".

An angle A1 between the primary guide plate 25 and the secondary guide plate 26 is set to be 15°-45°, and an angle A2 between the secondary guide plate 26 and the tertiary guide plate 27 is set to be 20°-45°.

A buffer groove 28 is formed in an inner wall of the flow distribution tank body 18, and corresponds to the core rod 19 in position. Exemplarily, the buffer groove 28 is arranged opposite to the core rod 19 in the horizontal direction such that the buffer groove 28 corresponds to the core rod 19 in position.

The workflow of the vacuum coating device of the present application is as follows:

1) A metal block is melted in the crucible 13 under the action of the induction heater 16 to form a molten metal 14, and the molten metal 14 starts to vaporize under higher superheat and low pressure, thereby gradually forming a metal steam 15;
2) At a beginning stage, the pressure regulating valve 23 on the metal steam pipeline 17 connected to the crucible 13 is in a closed state. The metal steam 15 in an inner cavity of the crucible 13 is constantly increased as the molten metal 14 is constantly vaporized, and when the pressure in the inner cavity of the crucible 13 reaches a certain value, the pressure regulating valve 23 is opened to keep it flowing out at a certain pressure;
3) At the moment, the power of the induction heater 16 needs to be increased such that the reduced pressure, due to the pressure regulating valve 23 being opened, is supplemented; the power range of the induction heater 16 is adjusted such that the pressure of the metal steam 15 in the inner cavity of the crucible 13 is kept to be within a constant range;
4) After the pressure regulating valve 23 is opened, the metal steam 15 flows forwards along the metal steam pipeline 17; when the metal steam 15 enters the flow distribution tank body 18, an original high-velocity airflow in the pipeline is blocked when passing through the core rod 19 due to the action of the primary guide plates 25, the secondary guide plates 26, and the tertiary guide plates 27 on the core rod 19, and the airflow flows around and is distributed along the primary guide plates 25, the secondary guide plates 26, and the tertiary guide plates 27 on the surface of the core rod 19;

5) the primary guide plates 25, the secondary guide plates 26, and the tertiary guide plates 27 arranged on the surface of the core rod 19 are used for distributing the airflow from the surface of the core rod 19 to a position away from the main airflow, and then deliver the uniform flow of the metal steam 15 into the distribution cavity in cooperation with the buffer groove 28 within the flow distribution tank body 18;

6) the heating holes 24 provided with resistance wires are arranged inside the core rod 19 to heat the core rod 19 during operation, so that the metal steam 15 flowing into the flow distribution tank body 18 cannot be solidified; the induction coil 22 is arranged outside the flow distribution tank body 18 to heat the entire flow distribution tank body 18, so that the metal steam 15 inside the flow distribution tank body 18 cannot be solidified while flowing;

7) the pressure stabilizing plate 20 is installed in the flow distribution tank body 18 and is used for secondary buffered distribution of the airflow of the metal steam 15 entering the distribution cavity, and then the uniform metal steam 15 flows out uniformly from the coating nozzle 21 on the top of the flow distribution tank body 18;

8) due to the narrow outlet of the coating nozzle 21, a greater velocity is formed when the metal steam 15 flows out; and at the moment, a moving steel plate 28 is arranged above the coating nozzle 21, and due to the higher temperature of the metal steam 15, the metal steam 15 is rapidly solidified when encountering the steel plate 28 having a lower temperature, thereby forming a metal coating 29.

The molten metal 14 may include metals such as zinc, magnesium, aluminum, tin, nickel, copper and iron, and in addition, may also include low-melting-point (less than 2000° C.) oxides of these elements.

A preprocessed metal plate 27 is cleaned by a plasma device or other devices before the vacuum coating, and its preheating temperature reaches 80-300° C.

Referring again to FIG. 11, a length L1 of the primary guide plate 25, a length L2 of the secondary guide plate 26, a length L3 of the tertiary guide plate 27, a length h of each opening hole 26*a* in the secondary guide plate 26/a length h of each opening hole 27*a* in the tertiary guide plate 27, a distance d between the adjacent opening holes 26*a* in the secondary guide plate 26/a distance d between the adjacent opening holes 27*a* in the tertiary guide plate 27, the power of the resistance wires and the pressure of the metal steam 15 in the metal steam pipeline 17 satisfy the following relationship: when the pressure of the metal steam 15 in the metal steam pipeline 17 is 1000-100000 Pa, L1/L3=0.2-0.4, L2/L3=0.4-0.7, h=2-6 mm, d=8-15 mm, and the power of the resistance wires is 8-20 KW/m$^2$.

In some embodiments, as the pressure of the metal steam 15 in the metal steam pipeline 17 is increased, a value of L1/L3 is increased, a value of L2/L3 is increased, a value of h is reduced, a value of d is increased, and the power of the resistance wires is increased.

Optionally, in some embodiments, when the pressure of the metal steam 15 in the metal steam pipeline 17 is 50000-100000 Pa, L1/L3=0.3-0.4, L2/L3=0.6-0.7, h=2-4 mm, d=12-15 mm, and the power of the resistance wires is 15-20 KW/m$^2$;

when the pressure of the metal steam 15 in the metal steam pipeline 17 is 10000-50000 Pa, L1/L3=0.25-0.3, L2/L3=0.5-0.6, h=3-5 mm, d=10-12 mm, and the power of the resistance wires is 10-15 KW/m$^2$; and when the pressure of the metal steam 15 in the metal steam pipeline 17 is 1000-10000 Pa, L1/L3=0.2-0.25, L2/L3=0.4-0.5, h=4-6 mm, d=8-10 mm, and the power of the resistance wires is 8-10 KW/m$^2$.

Figure 12:
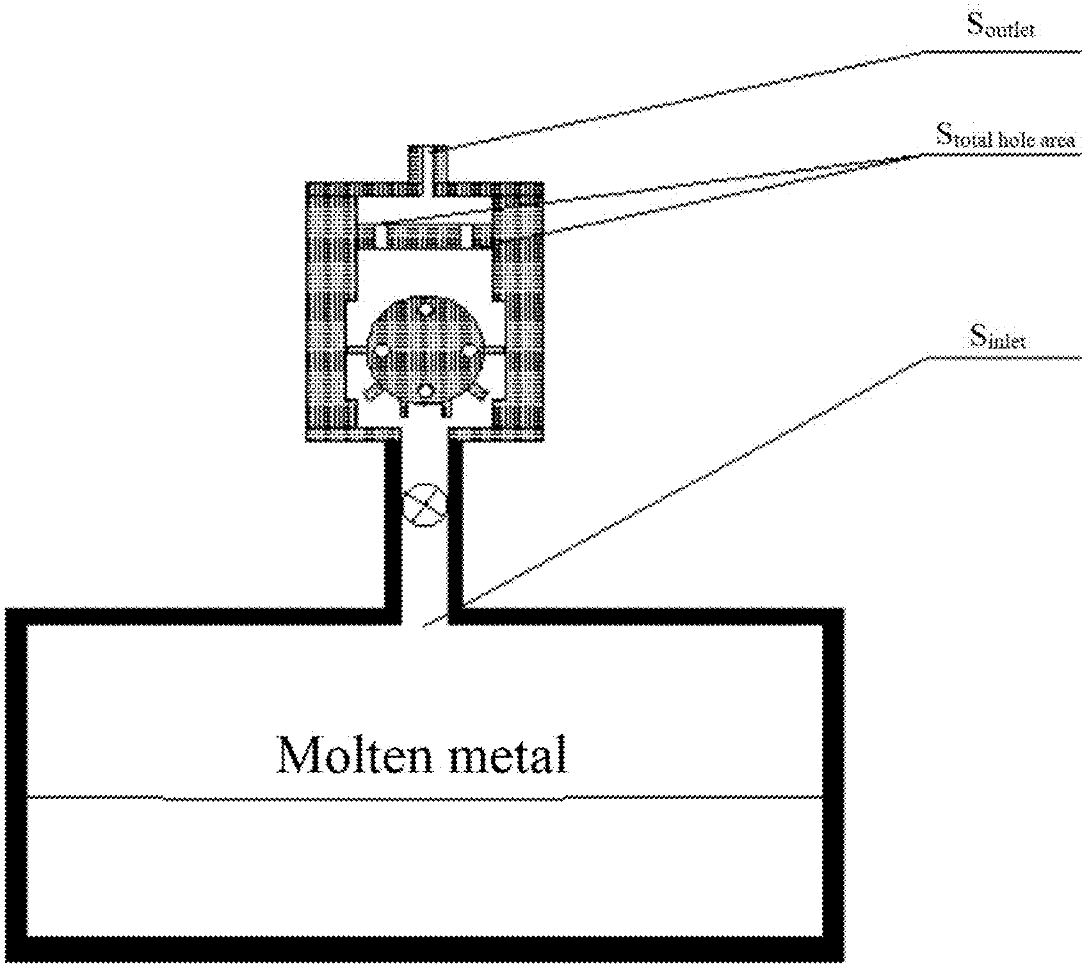
FIG. 12 is a schematic diagram of parameter area classifications in the vacuum coating device of FIG. 9.

Please refer to FIG. 12, the pressure stabilizing plate 20 is set to be of a porous structure, and a ratio of a total hole area $S_{total\ hole\ area}$ of the pressure stabilizing plate 20 to an airflow channel area $S_{outlet}$ at the outlet of the coating nozzle 21 is greater than or equal to 0.1, i.e., $S_{total\ hole\ area}/S_{outlet} \geq 0.1$.

The holes in the pressure stabilizing plate 20 (the porous structure) are circular, square, triangular or are of other shapes.

The holes in the pressure stabilizing plate 20 (the porous structure) extend in various forms, such as a straight line, a curved line, or a multi-layer structure.

The outlet of the coating nozzle 21 is set to be of a slit type or a porous type. The airflow channel area at the outlet of the coating nozzle 21 is $S_{outlet}$, and an airflow channel area at an interface of the top of the crucible 13 and the metal steam pipeline 17 is $S_{inlet}$, wherein a ratio of $S_{outlet}$ to $S_{inlet}$ is greater than or equal to 0.05-5, i.e., $S_{outlet}/S_{inlet} \geq 0.05$-5.

When being set to be of the slit type, the coating nozzle 21 has a straight or curved profile; or, when being set to be of the porous type, the coating nozzle 21 has a rectangular, circular, or trapezoidal profile or other profiles.

The coating nozzle 21 may be made of graphite, ceramic, or metal, or other materials that can be processed.

EMBODIMENT

Zinc evaporation coating on the surface of a steel plate 28 is adopted. The steel plate 28 has a width of 1200 mm, and the steel plate 28 is heated to 150° C. after washed and dried. The crucible 13 is heated with the induction heater 16 to evaporate zinc. The pressure of zinc steam in the crucible 13 reaches 60000 Pa by controlling the power, and at the moment, the pressure regulating valve 23 is in the closed state. When the pressure of the steam in the crucible 13 reaches 60000 Pa, the pressure regulating valve 23 is opened and the metal steam 15 enters the flow distribution tank body 18, in which the core rod 19 and the pressure stabilizing plate 20 are arranged, through the metal steam pipeline 17.

Figure 13:
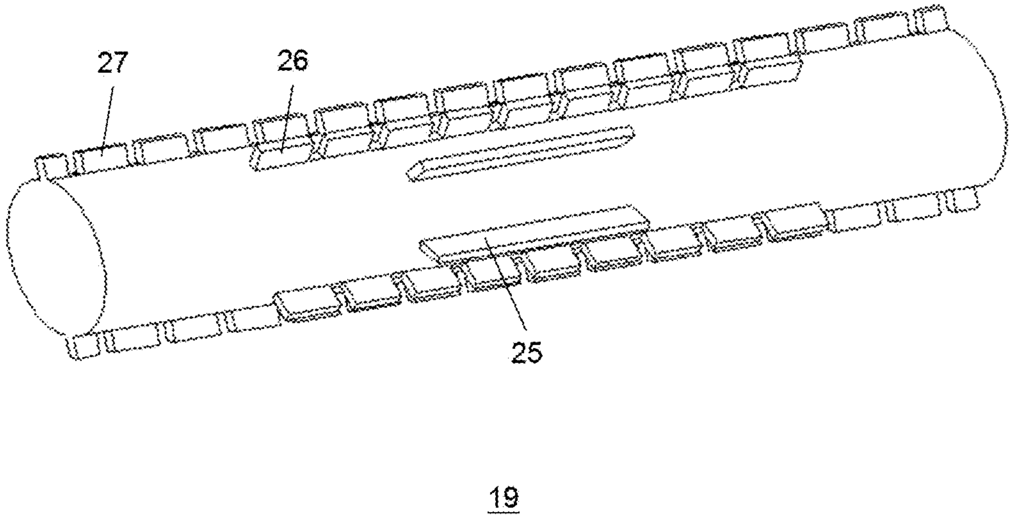
FIG. 13 is a schematic diagram of a core rod in the vacuum coating device provided by the embodiment of the present application.

The core rod 19 is set to be cylindrical (i.e., the core rod 19 has a circular cross section), and is provided with guide plates on the surface thereof. The angle A1 between the primary guide plate 25 and the secondary guide plate 26 is set to be 20°, and the angle A2 between the secondary guide plate 26 and the tertiary guide plate 27 is set to be 25°. A length ratio of the primary guide plate 25 to the tertiary guide plate 27 is L1/L3=0.35, and a length ratio of the secondary guide plate 26 to the tertiary guide plate 27 is L2/L3=0.65. The opening hole 26*a* in the secondary guide plate 26 has a length h=3 mm, and the opening hole 27*a* in the tertiary guide plate 27 has a length h=3 mm. The adjacent opening holes 26*a* in the secondary guide plate 26 have a distance d=13 mm, and the adjacent opening holes 27*a* in the tertiary guide plate 27 have a distance d=13 mm. The power of the resistance wires is set to be 18 $KW/m^2$, as shown in FIG. 13.

The pressure stabilizing plate 20 has a porous structure, and $S_{total\ hole\ area}/S_{outlet}=2.8$.

The working pressure inside the coating nozzle 21 is 55000 Pa. The coating nozzle 21 is made of graphite, and the outlet of the coating nozzle 21 is of the slit type and is rectangular, wherein $S_{outlet}/S_{inlet}=0.93$.

Those of ordinary skill in the art should realize that the above embodiments are merely used for illustrating the present application and not intended to limit the present application. Variations and modifications made to the above embodiments are intended to fall within the scope of the claims of the present application as long as they fall within the spirit of the present application.

The invention claimed is:

1. A vacuum coating device for uniformly distributing a metal steam, comprising:

a crucible, wherein a first induction heater for heating a molten metal in the crucible to form the metal steam is arranged outside the crucible, wherein a top of the crucible is connected to a flow distribution tank body by a metal steam pipeline;

a core rod and a pressure stabilizing plate which extend in a horizontal direction and are inside the flow distribution tank body, wherein the core rod is located below the pressure stabilizing plate;

a coating nozzle on a top of the flow distribution tank body;

a second induction heater outside the flow distribution tank body;

a pressure regulating valve on the metal steam pipeline;

wherein one or more heating holes extending in an axial direction of the core rod and are formed inside the core rod;

a resistance wire inside the heating holes, wherein a primary guide plate, a secondary guide plate and a tertiary guide plate are arranged on a surface of the core rod;

wherein the primary guide plate is arranged towards the metal steam pipeline;

wherein the secondary guide plate is arranged on an outer side of the primary guide plate;

wherein the tertiary guide plate is arranged on an outer side of the secondary guide plate; and a buffer groove formed in an inner wall of the flow distribution tank body, wherein the buffer groove corresponds to the core rod in position.

2. The vacuum coating device according to claim 1, wherein the buffer groove is arranged opposite to the core rod in the horizontal direction such that the buffer groove corresponds to the core rod in position.

3. The vacuum coating device according to claim 1, wherein the outer side of the primary guide plate is a side of the primary guide plate facing away from an orifice of the metal steam pipeline in a circumferential direction of the core rod; and the outer side of the secondary guide plate is a side of the secondary guide plate facing away from the orifice of the metal steam pipeline in the circumferential direction of the core rod.

4. The vacuum coating device according to claim 1, wherein the core rod has a circular, elliptical, trapezoidal or rectangular cross-section.

5. The vacuum coating device according to claim 1, wherein a length of the primary guide plate is less than a length of the secondary guide plate; and the length of the secondary guide plate is less than a length of the tertiary guide plate.

6. The vacuum coating device according to claim 5, wherein the secondary guide plate and the tertiary guide plate are each provided with opening holes arranged at equal intervals.

7. The vacuum coating device according to claim 6, wherein when a pressure of the metal steam in the metal steam pipeline is 1000-100000 Pa, L1/L3=0.2-0.4, wherein L1 is the length of the primary guide plate and L3 is the length of the tertiary guide plate, L2/L3=0.4-0.7 wherein L2 is the length of the secondary guide plate, h=2-6 mm, wherein h is a length of each opening hole in the secondary guide plate or each opening hole in the tertiary guide plate, d=8-15 mm, wherein d is a distance between adjacent opening holes in the secondary guide plate or between adjacent opening holes in the tertiary guide plate, and wherein a power of the resistance wire is 8-20 KW/m2.

8. The vacuum coating device according to claim 7, wherein when the pressure of the metal steam in the metal steam pipeline is 50000-100000 Pa, L1/L3=0.3-0.4, L2/L3=0.6-0.7, h=2-4 mm, d=12-15 mm, and the power of the resistance wire is 15-20 KW/m2;

wherein when the pressure of the metal steam in the metal steam pipeline is 10000-50000 Pa, L1/L3=0.25-0.3, L2/L3=0.5-0.6, h=3-5 mm, d=10-12 mm, and the power of the resistance wire is 10-15 KW/m2; and wherein when the pressure of the metal steam in the metal steam pipeline is 1000-10000 Pa, L1/L3=0.2-0.25, L2/L3=0.4-0.5, h=4-6 mm, d=8-10 mm, and the power of the resistance wire is 8-10 KW/m2.

9. The vacuum coating device according to claim 8, wherein the pressure stabilizing plate is set to be of a porous structure, and wherein a ratio of a total hole area $S_{total\ hole\ area}$ of the pressure stabilizing plate to an airflow channel area $S_{outlet}$ at an outlet of the coating nozzle is greater than or equal to 0.1, such that $S_{total\ hole\ area}/S_{outlet} \geq 0.1$.

10. The vacuum coating device according to claim 9, wherein the holes in the pressure stabilizing plate are circular, square or triangular shape.

11. The vacuum coating device according to claim 10, wherein the holes in the pressure stabilizing plate extend in a straight or curved line.

12. The vacuum coating device according to claim 6, wherein as a pressure of the metal steam in the metal steam pipeline is increased, a value of L1/L3 is increased, wherein L1 is the length of the primary guide plate and L3 is the length of the tertiary guide plate, a value of L2/L3 is increased, wherein L2 is the length of the secondary guide plate, a value of h is reduced, wherein h is a length of each opening hole in the secondary guide plate or each opening hole in the tertiary guide plate, a value of d is increased, wherein d is a distance between adjacent opening holes in the secondary guide plate or between adjacent opening holes in the tertiary guide plate, and wherein a power of the resistance wire is increased.

13. The vacuum coating device according to claim 12, wherein when the pressure of the metal steam in the metal steam pipeline is 50000-100000 Pa, L1/L3=0.3-0.4, L2/L3=0.6-0.7, h=2-4 mm, d=12-15 mm, and the power of the resistance wire is 15-20 KW/m2;

wherein when the pressure of the metal steam in the metal steam pipeline is 10000-50000 Pa, L1/L3=0.25-0.3, L2/L3=0.5-0.6, h=3-5 mm, d=10-12 mm, and the power of the resistance wire is 10-15 KW/m2;

wherein when the pressure of the metal steam in the metal steam pipeline is 1000-10000 Pa, L1/L3=0.2-0.25, L2/L3=0.4-0.5, h=4-6 mm, d=8-10 mm, and the power of the resistance wire is 8-10 KW/m2.

14. The vacuum coating device according to claim 1, wherein an angle between the primary guide plate and the secondary guide plate is 15°-45°, and an angle between the secondary guide plate and the tertiary guide plate is 20°-45°.

15. The vacuum coating device according to claim 1, wherein an outlet of the coating nozzle is set to be of a slit type or a porous type;

wherein an airflow channel area at the outlet of the coating nozzle is $S_{outlet}$; an airflow channel area at an interface of the top of the crucible and the metal steam pipeline is $S_{inlet}$, wherein a ratio of $S_{outlet}$ to $S_{inlet}$ is greater than or equal to 0.05, such that $S_{outlet}/S_{inlet} \geq 0.05$.

16. The vacuum coating device according to claim 15, wherein the coating nozzle is of the slit type and has a straight or curved profile; or wherein the coating nozzle is of the porous type, and has a rectangular, circular or trapezoidal profile.

17. The vacuum coating device according to claim 1, wherein the core rod is connected to the flow distribution tank body by means of threads or inlaying.

* * * * *